US010062999B2

(12) United States Patent
Yao et al.

(10) Patent No.: US 10,062,999 B2
(45) Date of Patent: Aug. 28, 2018

(54) WATERPROOF ELECTRICAL CONNECTOR HAVING AN INSULATIVE SHELL INSERT-MOLDED WITH A METAL SHELL

(71) Applicant: FOXCONN INTERCONNECT TECHNOLOGY LIMITED, Grand Cayman (KY)

(72) Inventors: Tao Yao, Huaian (CN); Jun Zhao, Huaian (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/476,982

(22) Filed: Apr. 1, 2017

(65) Prior Publication Data
US 2017/0288333 A1 Oct. 5, 2017

(30) Foreign Application Priority Data

Apr. 1, 2016 (CN) .......................... 2016 1 0198776
Dec. 30, 2016 (CN) .......................... 2016 1 1257746

(51) Int. Cl.
*H01R 13/648* (2006.01)
*H01R 13/432* (2006.01)
*H01R 13/658* (2011.01)
*H01R 11/12* (2006.01)
*H01R 13/58* (2006.01)
*H05K 9/00* (2006.01)
*H01R 12/70* (2011.01)
*H01R 13/04* (2006.01)

(52) U.S. Cl.
CPC ........... *H01R 13/432* (2013.01); *H01R 11/12* (2013.01); *H01R 12/7023* (2013.01); *H01R 13/04* (2013.01); *H01R 13/5841* (2013.01); *H01R 13/658* (2013.01); *H05K 9/0058* (2013.01)

(58) Field of Classification Search
CPC .. H01R 13/502; H01R 13/6581; H01R 43/24; H01R 13/6594; H01R 12/712; H01R 13/521
See application file for complete search history.

(56) References Cited

U.S. PATENT DOCUMENTS

| 8,827,742 | B2 | 9/2014 | Hon Hai | |
|---|---|---|---|---|
| 9,444,177 | B2* | 9/2016 | Tsai | H01R 13/5202 |
| 9,647,367 | B1* | 5/2017 | Emaci | H01R 13/03 |
| 9,711,910 | B2* | 7/2017 | Zhao | H01R 13/5202 |
| 9,728,916 | B1* | 8/2017 | Tsai | H01R 24/60 |
| 9,761,988 | B1* | 9/2017 | Lin | H01R 13/5216 |
| 2016/0104957 | A1 | 4/2016 | Tyco | |
| 2016/0294108 | A1 | 10/2016 | Lianzhan | |

FOREIGN PATENT DOCUMENTS

CN 204289872 4/2015

* cited by examiner

*Primary Examiner* — Xuong Chung Trans
(74) *Attorney, Agent, or Firm* — Wei Te Chung; Ming Shieh Chang

(57) ABSTRACT

An electrical connector includes: an insulative housing having a base portion and a tongue portion extending forwardly from the base portion; a number of terminals retained in the insulative housing; a shielding shell attached to the insulative housing to form a receiving space; a metal shell for mounting on a printed circuit board, the metal shell being affixed to the shielding shell; and an insulative shell insert-molded with the metal shell and enclosing the shielding shell.

18 Claims, 15 Drawing Sheets

US 10,062,999 B2

WATERPROOF ELECTRICAL CONNECTOR HAVING AN INSULATIVE SHELL INSERT-MOLDED WITH A METAL SHELL

BACKGROUND OF THE INVENTION

1. Field of the Invention

The present invention relates to a waterproof electrical connector having an insulative shell insert-molded with a metal shell.

2. Description of Related Art

China Patent No. 204289872, issued on Apr. 22, 2015, discloses a waterproof electrical connector. The electrical connector includes a shielding shell, a sub shell affixed to a top wall of the shielding shell, a terminal module, and an insulative shell. The insulative shell is insert-molded with the shielding shell and the sub shell. In insert-molding process, insulative materials are difficult to have a well-distributed formation as the sub shell is affixed to the shielding shell.

U.S. Pat. No. 8,827,742, issued on Sep. 9, 2014, discloses a waterproof electrical connector including a metallic shell, an insulative cover covering the metallic shell, and a metallic fixing member attached to a bottom face of the insulative cover. The fixing member is retained on the insulative cover by insert-molding and is to be mounted on a printed circuit board.

An improved electrical connector is desired.

SUMMARY OF THE INVENTION

One object of the present invention is to provide an electrical connector comprising: an insulative housing having a base portion and a tongue portion extending forwardly from the base portion; a plurality of terminals retained in the insulative housing; a shielding shell attached to the insulative housing to form a receiving space; a metal shell for mounting on a printed circuit board, the metal shell being affixed to the shielding shell; and an insulative shell insert-molded with the metal shell and enclosing the shielding shell.

Other objects, advantages and novel features of the invention will become more apparent from the following detailed description when taken in conjunction with the accompanying drawings.

DETAILED DESCRIPTION OF THE PREFERRED EMBODIMENT

Figure 1:
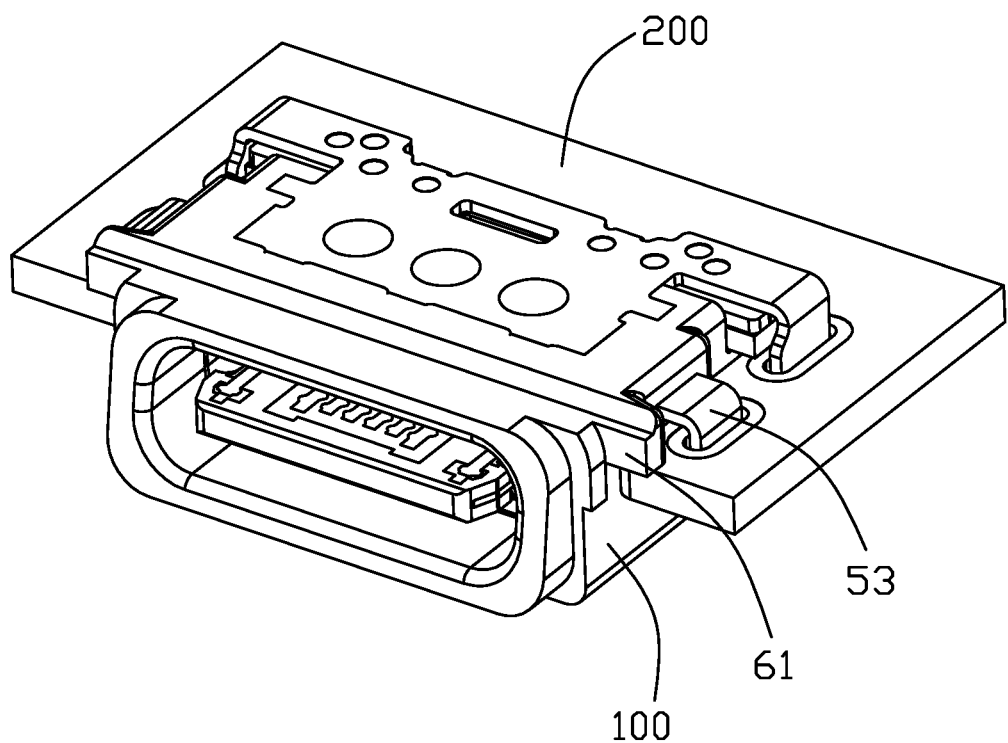
FIG. 1 is a perspective, assembled view of an electrical connector mounted upon a printed circuit board in a first embodiment.

Reference will now be made in detail to the preferred embodiment of the present invention.

FIGS. 1 to 11 show an electrical connector 100 mounted upon a printed circuit board 200 and cooperated with a plug connector in a first embodiment. For convenience, the electronic connector 100 defines a mating port, an insertion direction, a transverse direction perpendicular to the insertion direction and forming a horizontal plane therebetween, and a vertical direction perpendicular to the insertion direction and the transverse direction in FIG. 1.

Referring to FIGS. 1-11, the electrical connector 100 includes an insulative housing 1, a number of terminals 2 and a metallic shielding plate 3 retained in the insulative housing 1, a shielding shell 4 attached to the insulative housing 1 and forming a receiving space 40 therebetween, a metal shell 5 attached to the shielding shell 4, an insulative shell 6, and a glue wall 7 seal up gaps between the shielding shell 4 and the insulative housing 1.

Figure 9:
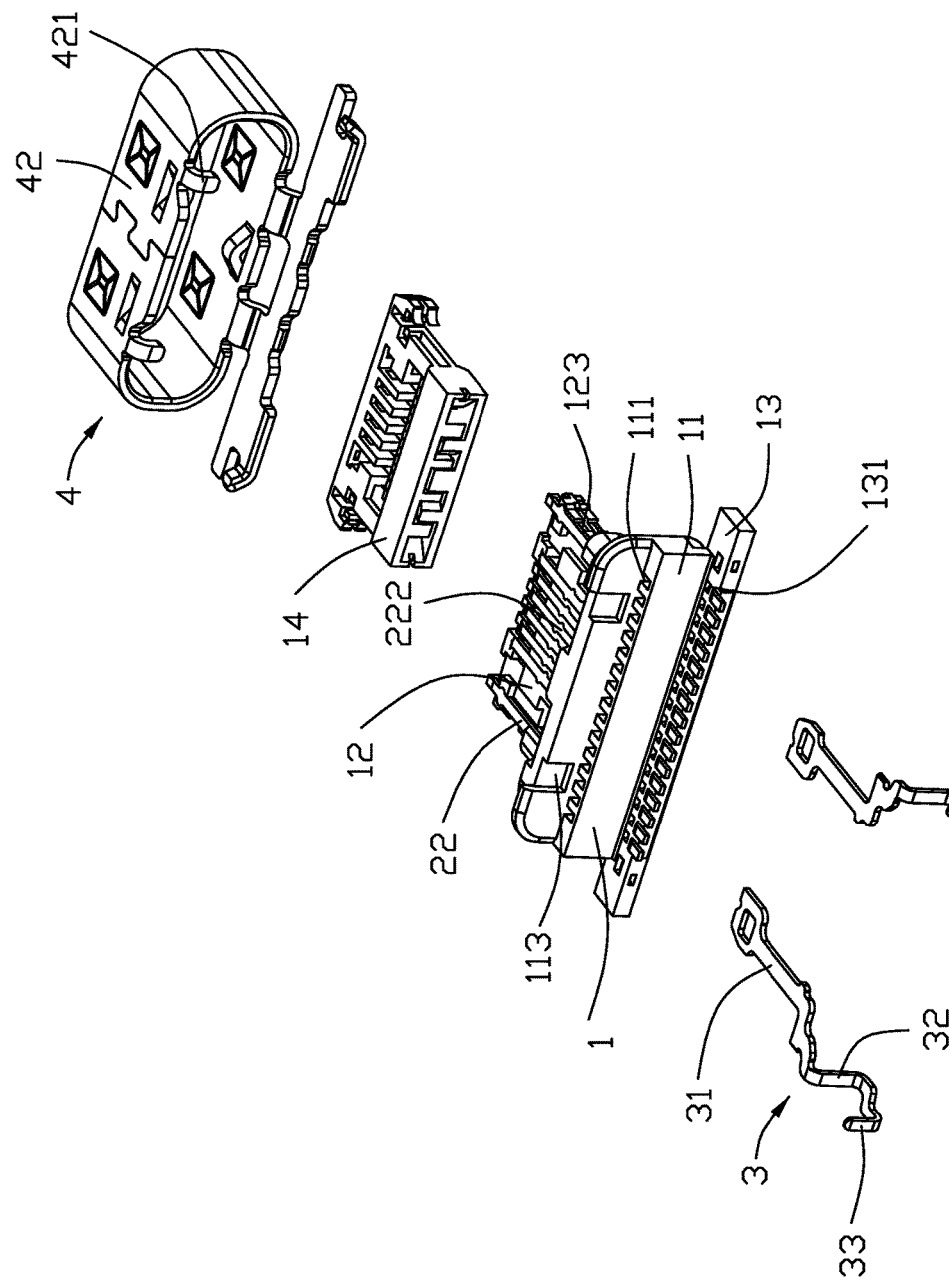
FIG. 9 is another perspective view of FIG. 8 in the first embodiment.
Figure 10:
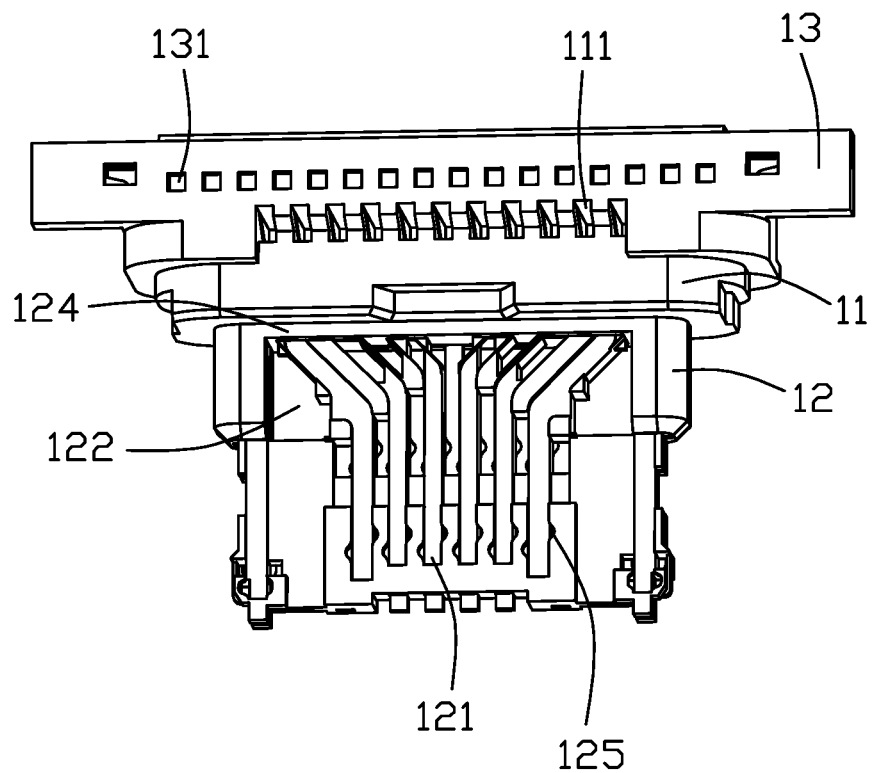
FIG. 10 is a perspective view of the insulative housing with the terminals and the metallic shielding plate and with no insulator in the first embodiment.

Referring to FIGS. 6 to 10, the insulative housing 1 includes a base portion 11, a tongue portion 12 extending forwardly from the base portion 11, and a rear portion 13 extending rearward from the base portion 11. The base portion 11 has a row of through-holes 111 communicated with an upper surface and a lower surface thereof and close to the rear portion 13 to flow glue materials, and a pair of receiving depressions 113 located behind the receiving holes 112. The tongue portion 12 defines a number of terminal-receiving slots 121 extending along the insertion direction and located at an upper surface and a lower surface, and a hollow part 122 located around the terminal-receiving slots 121. The terminal-receiving slots 121 located at the upper surface is offset with the terminal-receiving slots 121 located at the lower surface to insert module and locate the terminals 2. The tongue portion 12 defines a pair of clasping portion 123 located at two sides thereof. Outmost ones of the terminals 2 are exposed from two sides of the tongue portion 12 to locate the module and prevent inclining in filling insulative materials. The insulative housing 1 further has an insulator 14 insert-molded with the tongue portion 12. Referring to FIG. 10, the tongue portion 12 defines a pair of operating portions located at the upper surface and the lower surface and close to the base portion 11 to place module in insert-molding process to prevent excessive glue materials. Each terminal-receiving slot 121 defines a pair of ear grooves 125 located at two sides thereof and communicated therewith to place module. The rear portion 13 has a number of inspecting holes 131 extending from an upper surface to a lower surface thereof to observe arrangements of the terminals 2.

Figure 7:
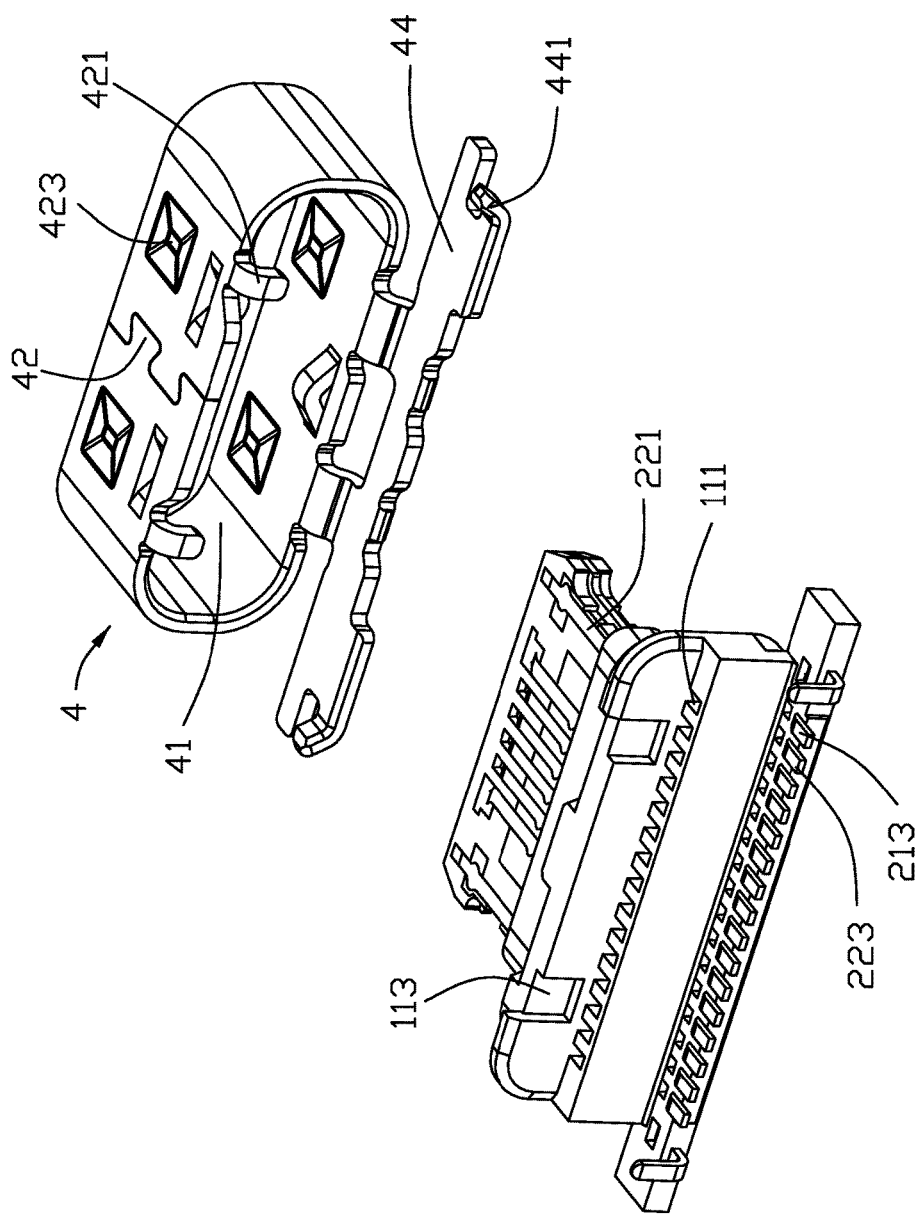
FIG. 7 is another perspective view of FIG. 6 in the first embodiment.
Figure 8:
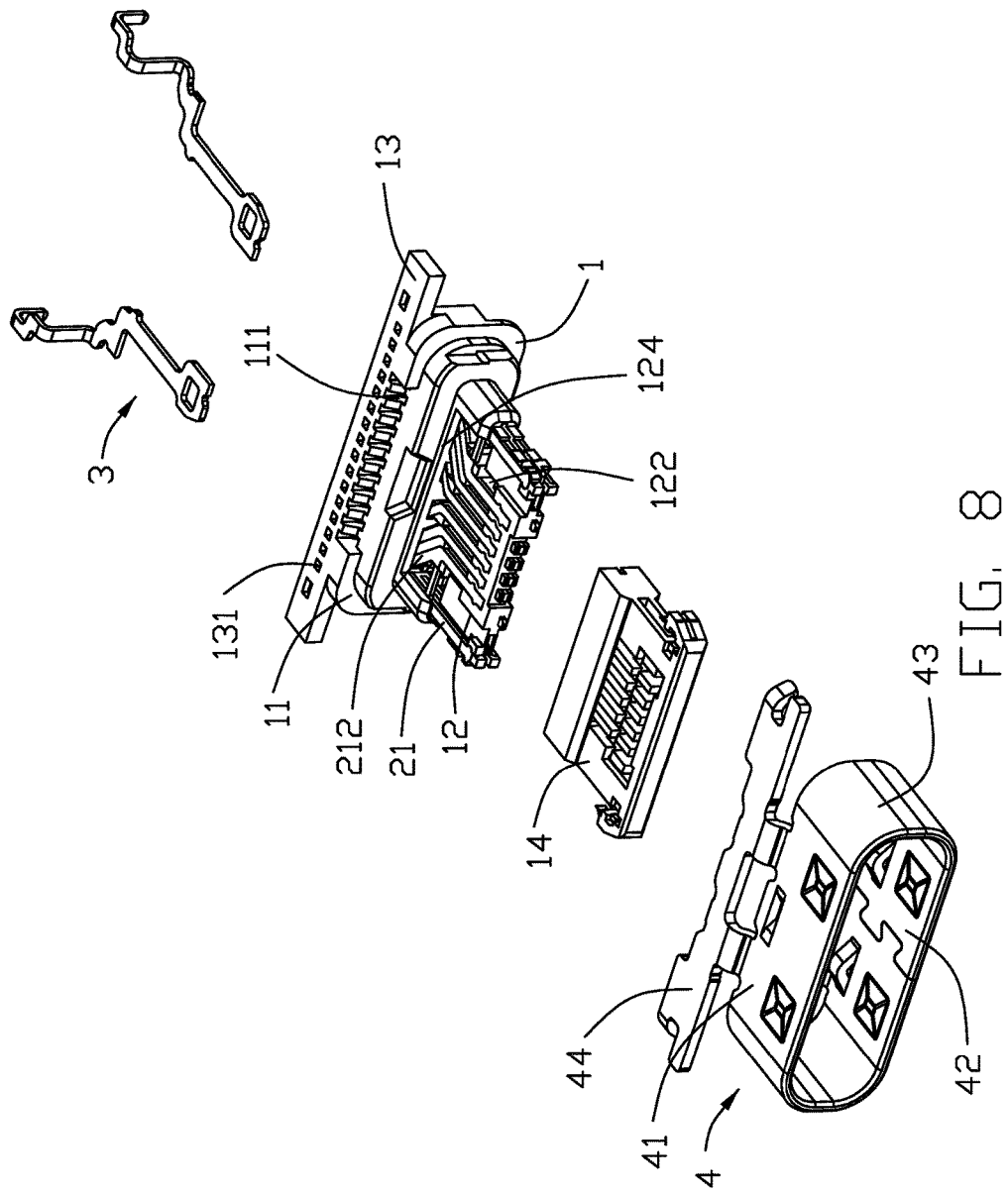
FIG. 8 is a further exploded view of FIG. 8 in the first embodiment.

Referring to FIGS. 7 and 9, the terminals 2 include a number of first contacts 21 carried by the first surface 121 of the tongue portion 12 and a number of second contacts 22 carried by the second surface 122 of the tongue portion 12. The first contacts 21 and the second contacts 22 extending in an insertion direction respectively includes four power contacts located forwardly and eight signal contacts located backwardly. The two power contacts in the middle are used to provide electric source and the other two are used for electrical grounding. The eight signal contacts includes four super-speed differential contacts located at two sides, two low-speed differential contacts located in the middle, and a pair of controlling contacts. Each of the first contacts 21 is associated with a respective one of the second contacts 22 and is positioned in reverse symmetry with respect to the second contacts 22.

Figure 6:
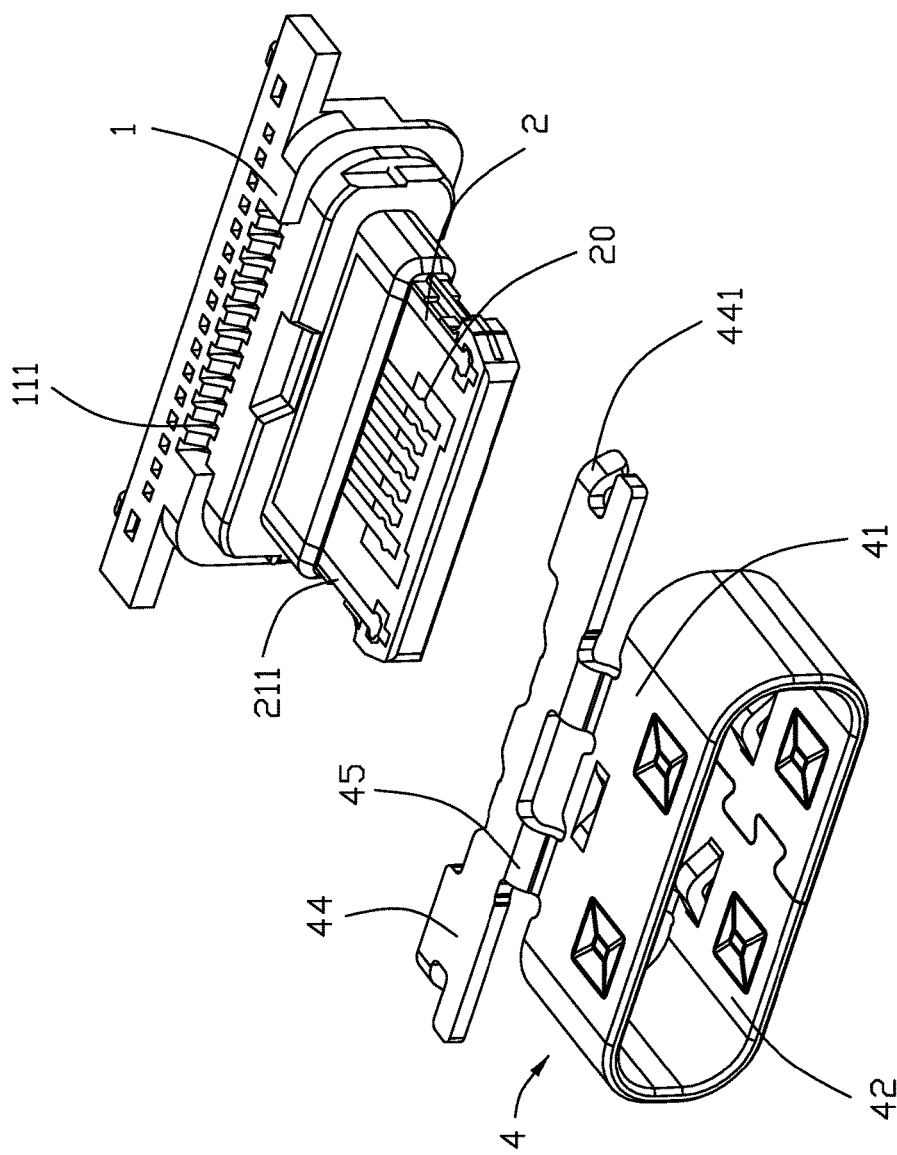
FIG. 6 is a perspective view of FIG. 4 with no metal shell and separated from the metal shell in the first embodiment.

Each of the first contacts 21 includes a first contacting portion 211 exposed from the tongue portion 12, a first connecting portion 212, and a first soldering portion 213. Each of the second contacts 22 includes a second contacting portion 221 exposed from the tongue portion 12, a second connecting portion 222 retained in the tongue portion 12, and a second soldering portion 223 located at a same plane with the first soldering portions 213. Referring to FIG. 6, each first contacting portion 211 together with each second contacting portion 221 defines a pair of dimples 20 located at two sides thereof and extending laterally. The dimples 20 are received in the ear grooves 125 and the dimples 20 of each terminal 2 are staggered along the insertion direction to insert the module in the dimples 20.

The metallic shielding plate 3, disposed as two pieces separated from each other, each includes a first supporting portion 31, a second supporting portion 32 bent upwardly then extending rearward, and a soldering leg 3 extending downwardly from a rear end of the second supporting portion 32. Front ends of the first supporting portions 31 are exposed from the tongue portion 12 and imbedded in the insulator 14.

Figure 2:
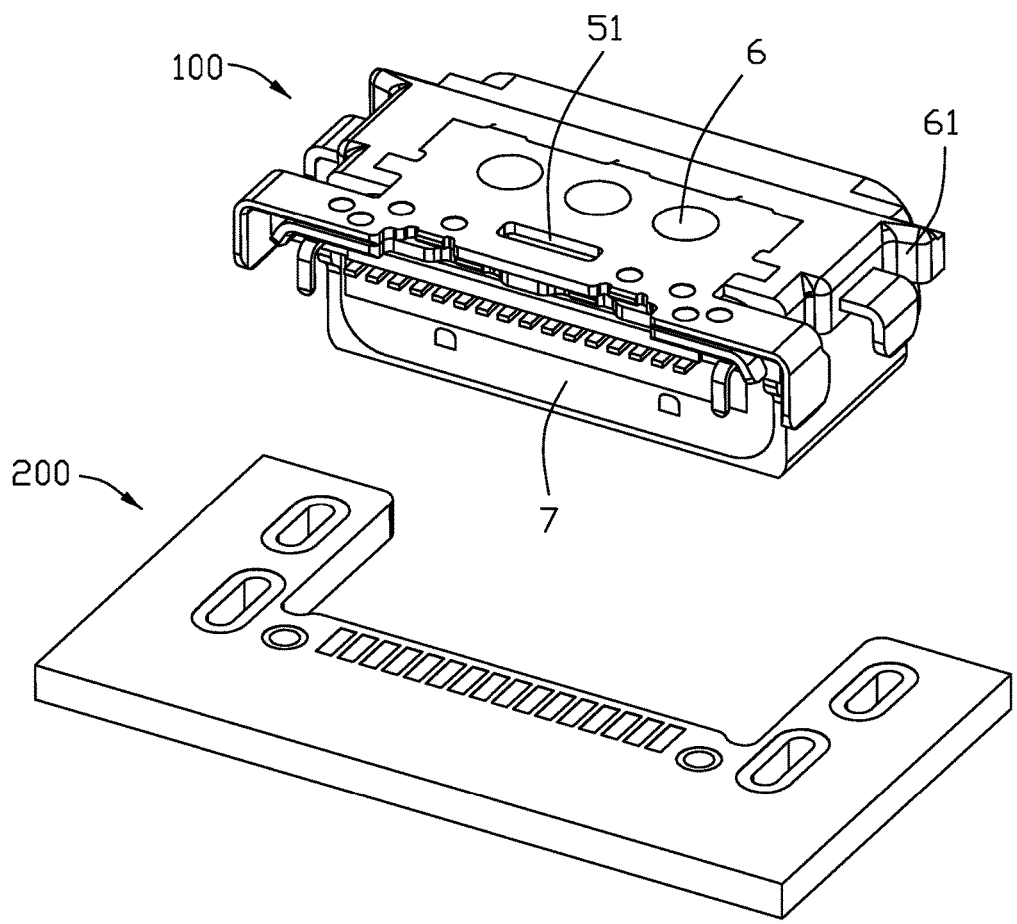
FIG. 2 is a perspective view of the electrical connector separated from the printed circuit board in the first embodiment.
Figure 3:
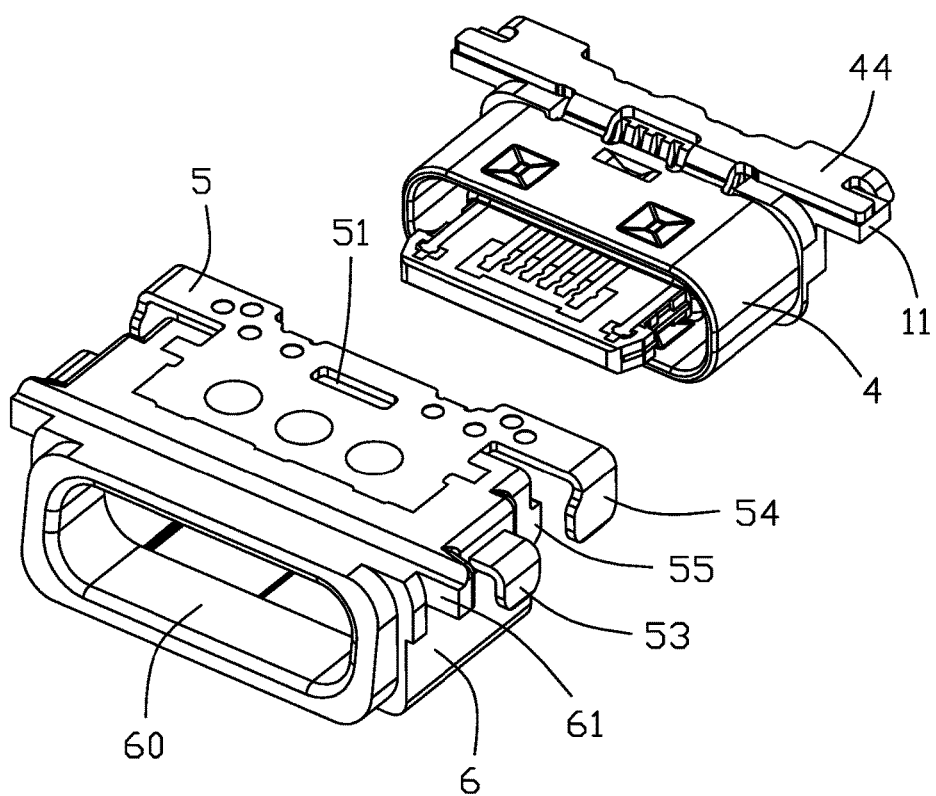
FIG. 3 is a perspective view of the electrical connector separated from an insulative shell and a metal shell with no glue wall in the first embodiment.
Figure 4:
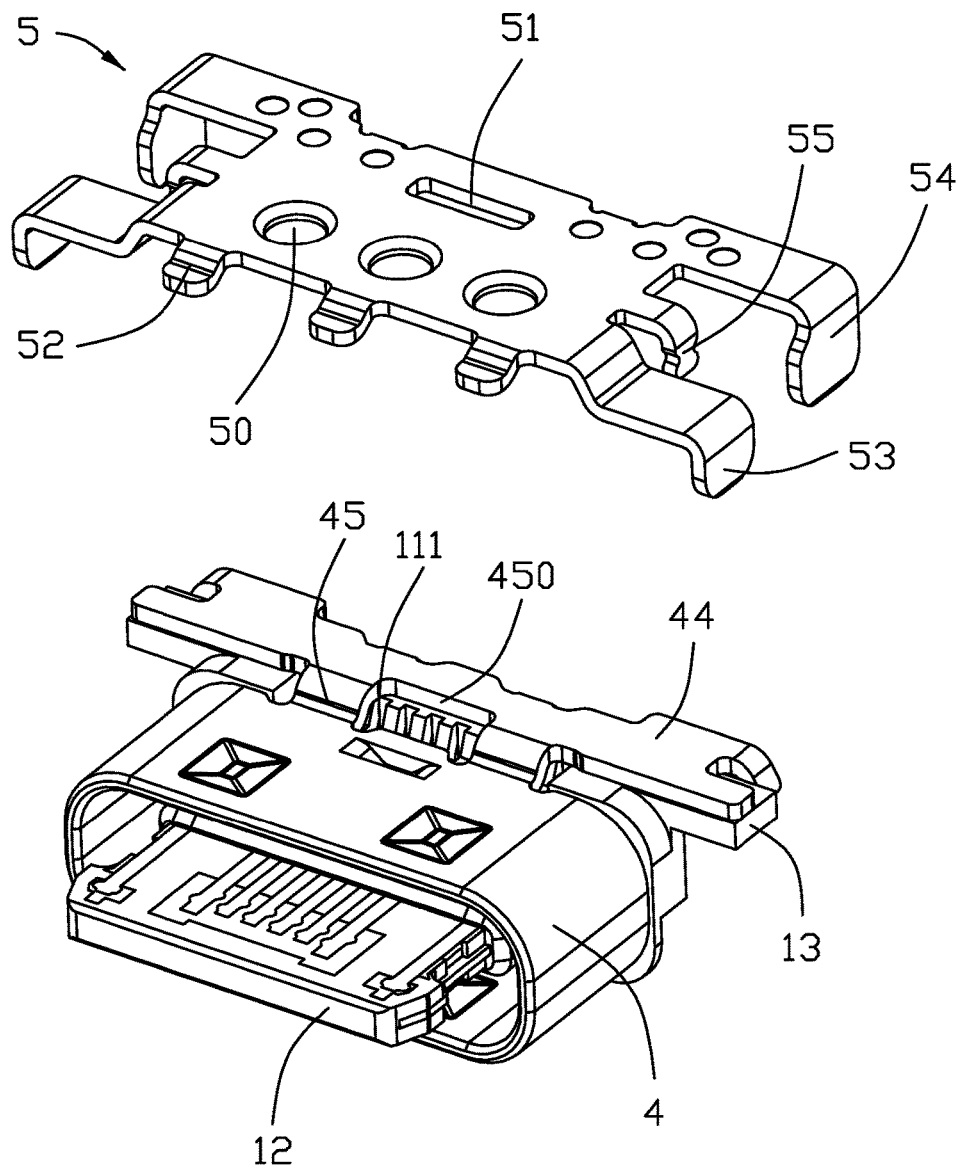
FIG. 4 is a perspective view of the electrical connector with no glue wall and insulative shell and separated from the metal shell in the first embodiment.
Figure 5:
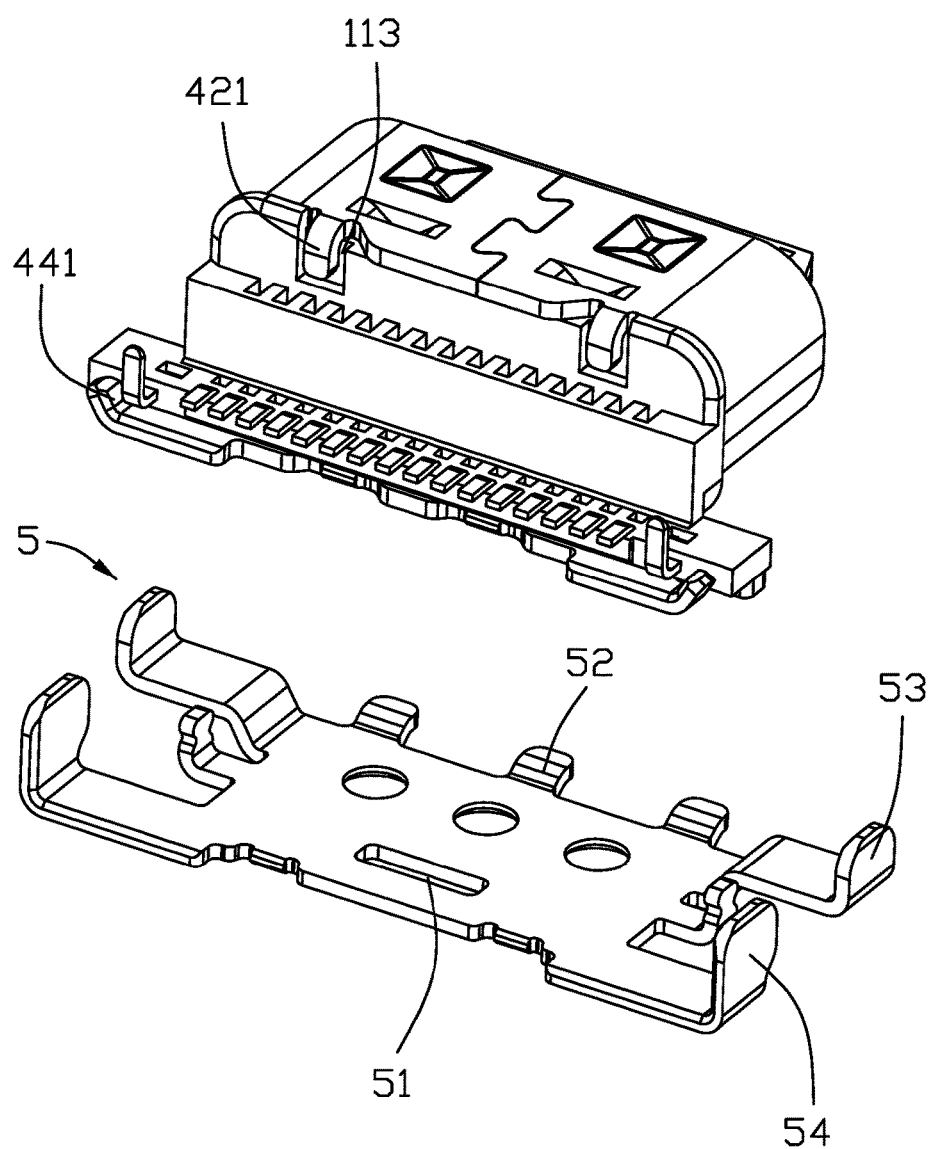
FIG. 5 is another perspective view of FIG. 4 in the first embodiment.

Referring to FIGS. 1 to 9, the shielding shell 4 includes a top wall 41 and a bottom wall 42 located oppositely, a pair of side walls 43 connected with the top wall 41 and the bottom wall 42, a tail portion 44 extending rearward form the top wall 41 and higher than the top wall 41 along the vertical direction, and a connection 45 connected with the top wall 41 and the tail portion 46. Referring to FIG. 7, the bottom wall 42 has a pair of first clasping arms 421 bent downwardly from a rear end thereof to receive in the receiving depressions 113 to firmly affix the insulative housing 1 and the shielding shell 4. The tail portion 44 has a pair of second affixed arms 441 resisting a rear end of the insulative housing 1. Referring to FIGS. 4 and 5, the tail portion 44 extending along the transverse direction is located close to an upper surface of the rear portion 13. Referring to FIG. 4, the connection 45 has an opening 450 to expose part of the through-holes 111. The tongue portion 12 is exposed from the mating port of the shielding shell 4.

Referring to FIGS. 1 to 5, the metal shell 5 shaped like a panel is attached to an upper surface of the shielding shell 4. Referring to FIGS. 4 and 5, the metal shell 5 has a number of holding holes 50 and an air-bleed hole 51 located behind the holding holes 50 and corresponding to the opening 450. The metal shell 5 has a pair of first affixed arms 52 located at a front end and resisting an upper surface of the top wall 41 of the shielding shell 4, a pair of first affixed legs 53 and second affixed legs 54 located at two sides thereof, and a pair of second affixed arms 55 located between the first affixed legs 53 and the second affixed legs 54 along the insertion direction. Referring to FIGS. 3 to 5, the first affixed legs 53 are located lower than the second affixed legs 54 along the vertical direction and the second affixed arms 55 resist two sides of the base portion 11. Referring to FIG. 3, a rear end of the metal shell is affixed to the rear portion 44 of the shielding shell 4 in spot welding process.

The insulative shell 6 is insert-molded with the metal shell 5 to form a receiving cavity 60 receiving the tongue portion 12 exposed from the shielding shell 4. Referring to FIGS. 1 and 2, a rear surface is located in front of the rear portion 13 of the insulative housing 1 and the tail portion 44 of the shielding shell 4. The insulative shell 6 has a pair of pillars 61 extending laterally from two sides thereof to enhance structural strength. The insulative shell 6 fills the holding holes 50 of the metal shell 5 to enhance stability therebetween. The insulative shell 6 is supported by the circuit board 200 to decrease the probability of instability of the first affixed legs 53 in the insulative shell 6 insert-molding with the metal shell 5.

Figure 11:
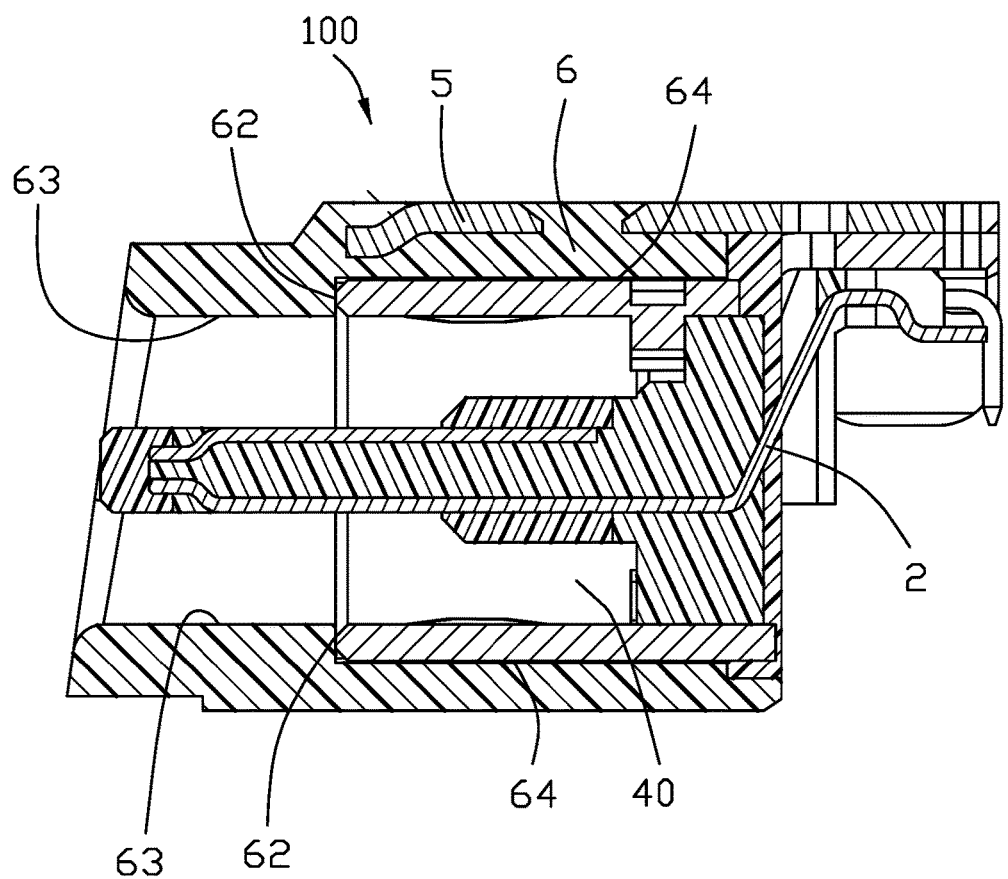
FIG. 11 is a cross-sectional view of the electrical connector along line 11-11 in FIG. 1 in the first embodiment.
Figure 12:
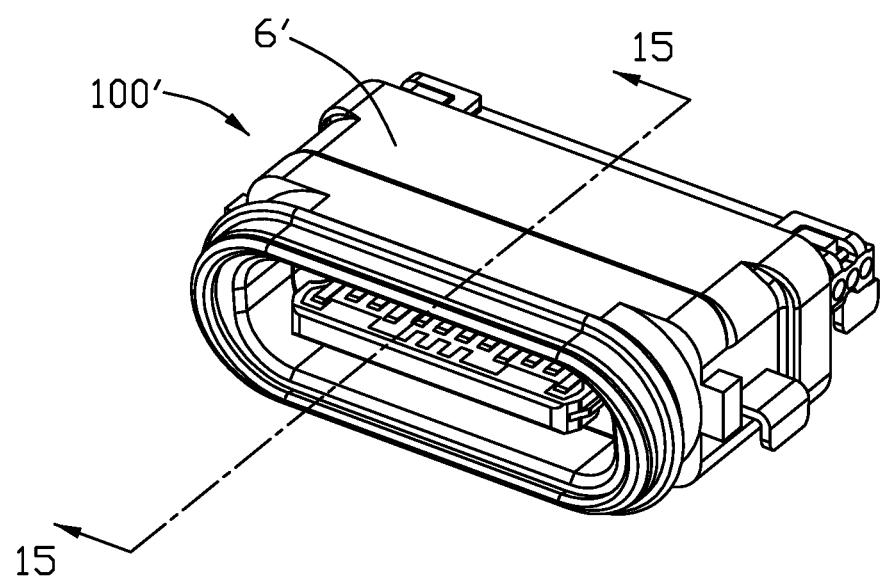
FIG. 12 is a perspective, assembled view of an electrical connector in a second embodiment.
Figure 13:
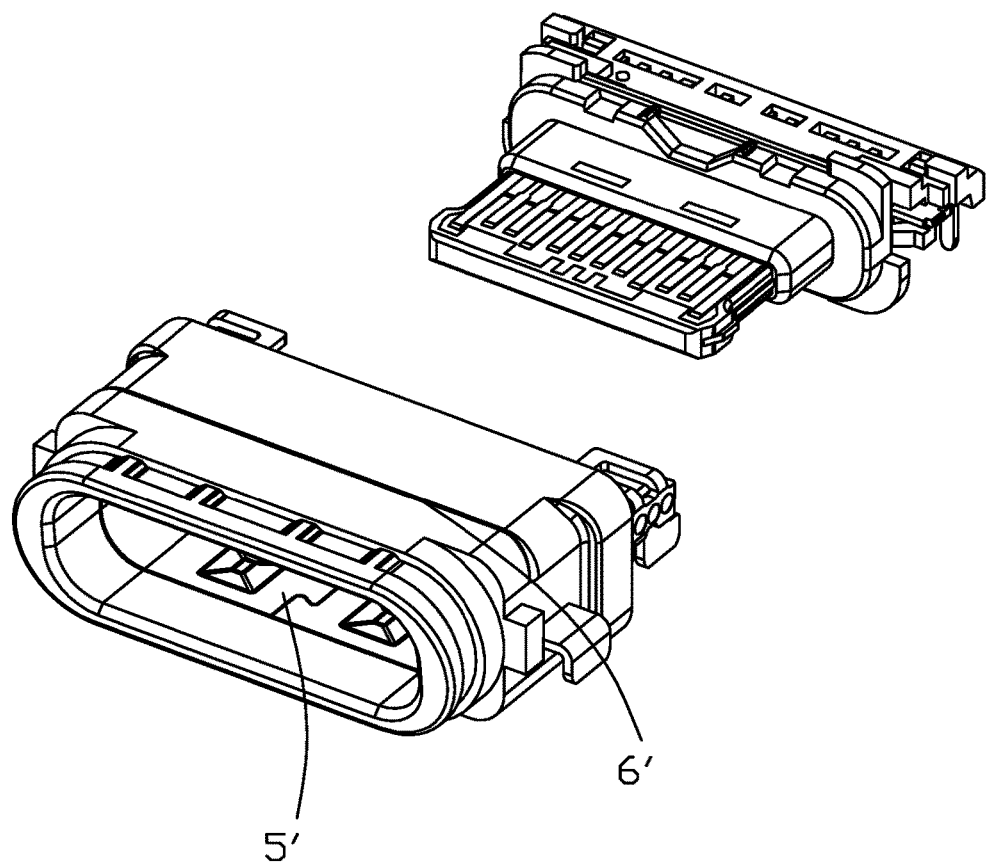
FIG. 13 is a perspective, partly exploded view of the electrical connector in the second embodiment.

Referring to FIG. 11, the insulative shell 6 defines a pair of stepping portion 62 located at an upper inner surface and a lower inner surface to divide the upper surface and the lower surface with a pair of front inner surfaces 63 located in front of the stepping portions 62 and a pair of rear inner surfaces 64 located behind the stepping portions 62. The pair of front inner surfaces 63 defines a distance therebetween smaller than that between the pair of rear inner surfaces 64. Outer surfaces of the top wall 41 and the bottom wall 42 of the shielding shell 4 contacts close to the rear inner surfaces 64 to resist front ends of the shielding shell 4 with the stepping portions 62 and inner surfaces of the shielding shell 4 are aligned with the front inner surfaces 63 of the insulative shell 6. A lower wall of the insulative shell 6 is outstanding with an upper wall of the insulative shell 6.

Referring to FIG. 2, glue materials flow from the opening 450 and the through-holes 111 to form the glue wall 7 and seal up gaps between the base portion 11 with the rear portion 13 and the insulative shell 6. The air-bleed hole 51 of the metal shell 5 gets rid of air in the glue-flowing passages in flowing glue materials.

A method of making the electrical connector 100 includes the steps of: providing a number of terminals 2 and a metallic shielding plate 3, insert-molding the insulative housing 1 with the terminals 2 and the metallic shielding plate 3; insert-molding the insulator 4 with the insulative housing 1 in second times; providing the shielding shell 4 and assembling the shielding shell 4 to the insulative housing 1; providing the metal shell 5, insert-molding the insulative shell 6 with metal shell 5; assembling the insulative shell 6 with the metal shell 5 to the shielding shell 4; laser soldering the metal shell 5 with the shielding shell 4; glue materials flowing through the opening 450 and the through-holes 111 to form the glue wall 7.

Figure 14:
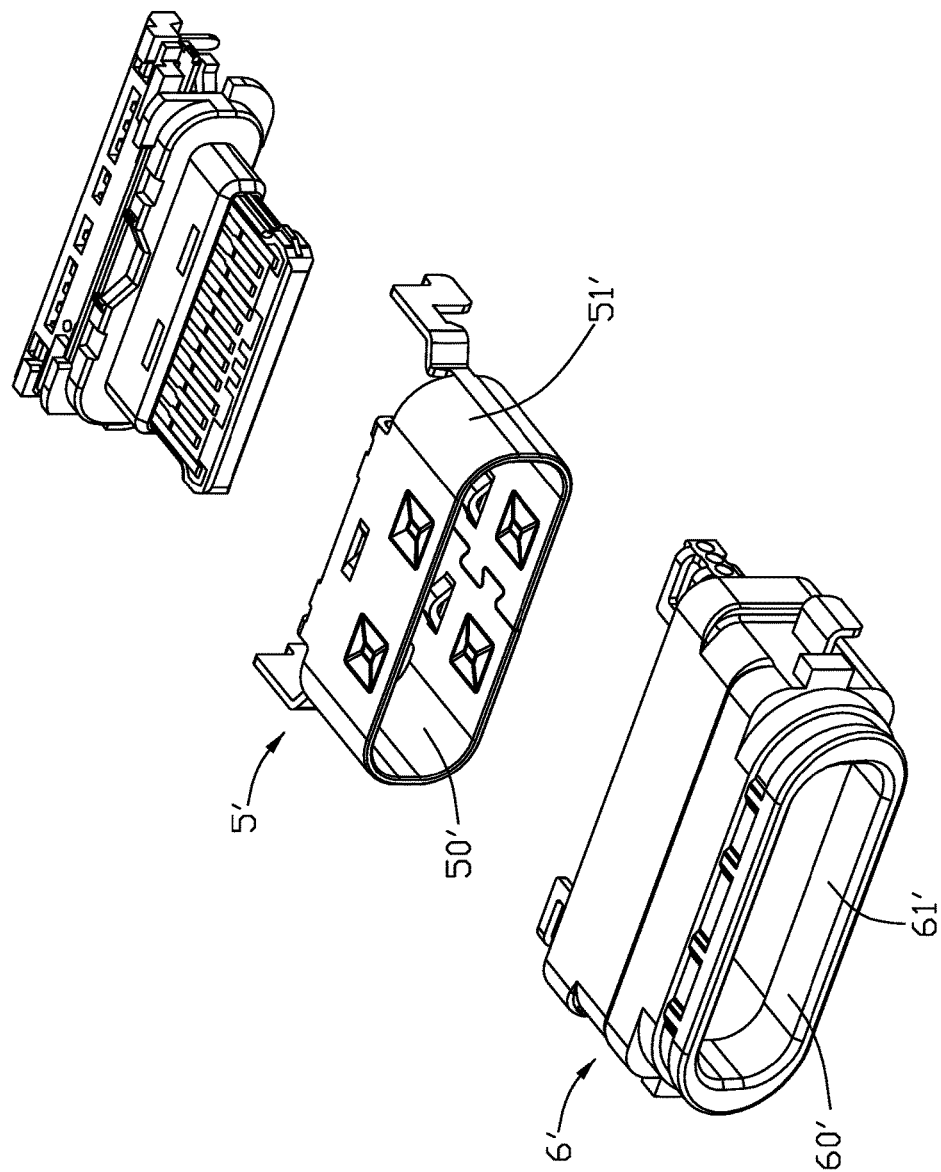
FIG. 14 is a further exploded view of FIG. 13 in the second embodiment.
Figure 15:
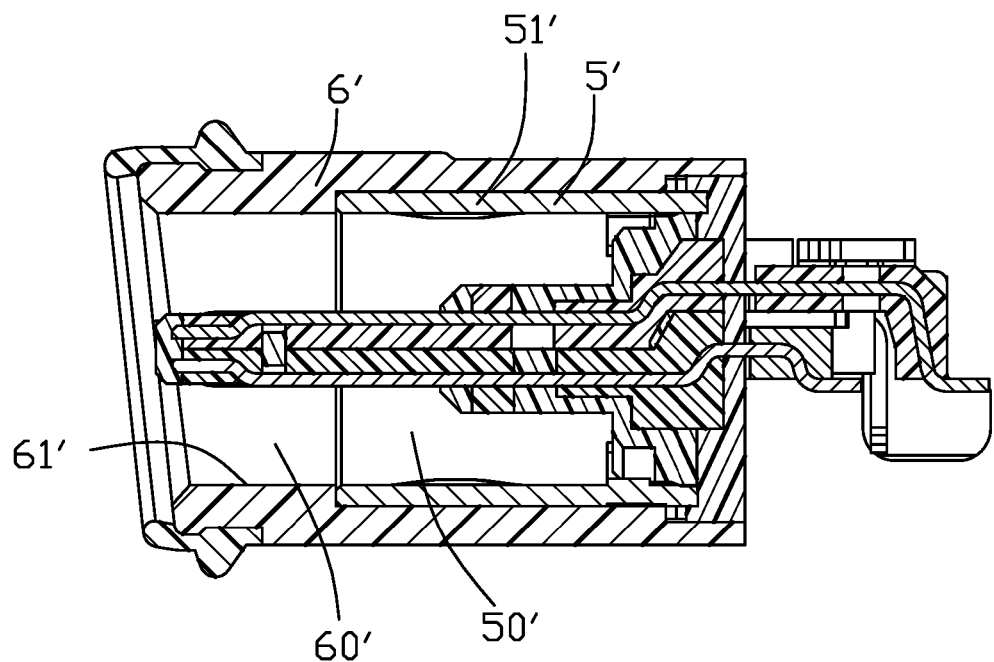
FIG. 15 is a cross-sectional view of the electrical connector along line 15-15 in FIG. 12.

FIGS. 12 to 15 show an electrical connector 100' cooperated with a plug connector in a second embodiment. The electrical connector 100' includes a metallic shell 5' attached to the insulative housing 1 and an insulative shell 6' insert-molded with the metallic shell 5'. Referring to FIG. 14, the metallic shell 5' has a tubular main shell 51' forming a receiving space 50' to receive the insulative housing 1. The insulative shell 6' defines a pair of inner surfaces 61' located at an upper surface and a lower surface and a receiving cavity 60' receiving the tongue portion 12 of the insulative housing 1 exposed from the metallic shell 5'. The main shell 51' of the metallic shell 5' is embedded into the inner surfaces 61' of the insulative housing 6' and inner walls of the metallic shell 5' are aligned with the inner surfaces 61' of the insulative shell 6'. In other words, in the second embodiment the insulative shell is integrally formed with the shielding shell, rather than the metal shell, of the first embodiment via an insert-molding process. This arrangement may benefit waterproof between the insulative shell and the shielding shell. Therefore, the invention is to have the insulative shell integrally, via an insert-molding process, formed with either the inner metallic shell, i.e., the shielding shell in the first embodiment which is directly attached to the insulative housing without affixed legs, or the outer metallic shell, i.e., the metal shell which is equipped with the affixed legs for mounting to the printed circuit board, so as to perform better waterproof function thereof.

However, the disclosure is illustrative only, changes may be made in detail, especially in matter of shape, size, and arrangement of sections within the principles of the invention.

What is claimed is:

1. An electrical connector comprising:
   an insulative housing having a base portion and a tongue portion extending forwardly from the base portion;
   a plurality of terminals retained in the insulative housing;
   a shielding shell attached to the insulative housing to form a receiving space;
   a metal shell positioned around an outside of the shielding shell and having a plurality of affixed legs for mounting on a printed circuit board; and
   an insulative shell surrounding the shielding shell and integrally formed with at least one of the metal shell and the shielding shell via an insert-molding process so as to achieve waterproof function; wherein
   the shielding shell includes a tail portion, and the metal shell includes a rear end welded to the tail portion.

2. The electrical connector as claimed in claim 1, wherein the shielding shell forms no soldering legs.

3. The electrical connector as claimed in claim 1, wherein said insulative shell is integrally formed with only the metal shell.

4. The electrical connector as claimed in claim 1, wherein said metal shell has a number of holding holes filled by insulative materials forming the insulative shell.

5. The electrical connector as claimed in claim 1, wherein the tongue portion is exposed from the shielding shell, and the insulative shell defines a receiving cavity receiving the exposed tongue portion.

6. The electrical connector as claimed in claim 5, wherein the insulative shell defines a pair of stepping portions located at an upper inner surface and a lower inner surface thereof to divide the upper surface and the lower surface with a pair of front inner surfaces located in front of the stepping portions and a pair of rear inner surfaces located behind the stepping portions, and outer surfaces of the shielding shell contact at a position close to the rear inner surfaces to resist front ends of the shielding shell with the stepping portions.

7. The electrical connector as claimed in claim 5, wherein said pair of front inner surfaces defines a distance therebetween smaller than a distance between the pair of rear inner surfaces, and inner surfaces of the shielding shell are aligned with the front inner surfaces of the insulative shell.

8. The electrical connector as claimed in claim 7, wherein a lower wall of the insulative shell is exposed forwardly from an upper wall of the insulative shell.

9. The electrical connector as claimed in claim 1, wherein said metal shell has a pair of first affixed legs and second affixed legs located at two sides thereof, and the first affixed legs are located lower than the second affixed legs along a vertical direction.

10. The electrical connector as claimed in claim 1, wherein the insulative housing has a rear portion extending rearwardly from the base portion, and the tail portion of the shielding shell extends outside the insulative shell over the rear portion.

11. An electrical connector comprising:
    an insulative housing having a base portion and a tongue portion extending forwardly from the base portion;
    a plurality of terminals retained in the insulative housing;
    a shielding shell attached to the insulative housing to form a receiving space, the tongue portion exposed out of the receiving space; and
    an insulative shell enclosing the shielding shell to form a receiving cavity to receive the tongue portion extending forwardly beyond the shielding shell, the insulative shell defining a stepping portion on thereof an interior surface facing the receiving cavity to form a front inner surface located in front of the stepping portion and a rear inner surface located behind the stepping portion, wherein
    the shielding shield is located behind the stepping portion and an exterior surface of the shielding shell intimately contacts the rear inner surfaces of the insulative shell; and
    the insulative shell is insert molded with the shielding shell.

12. The electrical connector as claimed in claim 11, wherein an interior surface of the shielding shell is coplanar with the front inner surface of the insulative shell.

13. The electrical connector as claimed in claim 11, wherein a front edge of the shielding shell abuts forwardly against the stepping portion.

14. The electrical connector as claimed in claim 11, further including a metal shell associated with the insulative shell, wherein the metal shell includes a plurality of affixed legs for mounting to a printed circuit board while the shielding shell has no affixed legs thereof.

15. An electrical connector comprising:
    an insulative housing having a base portion and a tongue portion extending forwardly from the base portion;
    a plurality of terminals retained in the insulative housing;
    a shielding shell attached to the insulative housing to form a receiving space, the tongue portion exposed out of the receiving space;
    an insulative shell enclosing the shielding shell to form a receiving cavity to receive the tongue portion extending forwardly beyond the shielding shell, the insulative shell defining a stepping portion on thereof an interior surface facing the receiving cavity to form a front inner surface located in front of the stepping portion and a rear inner surface located behind the stepping portion; and
    a metal shell associated with the insulative shell, wherein the metal shell includes a plurality of affixed legs for mounting to a printed circuit board; wherein
    the shielding shield is located behind the stepping portion and an exterior surface of the shielding shell intimately contacts the rear inner surfaces of the insulative shell; wherein the shielding shell is welded to the metal shell at a position behind the insulative shell in a front-to-back direction.

16. The electrical connector as claimed in claim 15, wherein at said position, the shielding shell is sandwiched between the metal shell and the insulative housing in a vertical direction perpendicular to said front-to-back direction.

17. The electrical connector as claimed in claim 16, wherein said terminals includes soldering portions right under said position.

18. The electrical connector as claimed in claim 15, wherein said insulative shell is insert molded with at least one of the shielding shell and the metal shell.

\* \* \* \* \*